(12) United States Patent
Zhang et al.

(10) Patent No.: US 10,972,130 B2
(45) Date of Patent: Apr. 6, 2021

(54) ENCODING METHOD, DECODING METHOD, ENCODING APPARATUS, AND DECODING APPARATUS

(71) Applicant: HUAWEI TECHNOLOGIES CO., LTD., Shenzhen (CN)

(72) Inventors: Chaolong Zhang, Hangzhou (CN); Lingchen Huang, Hangzhou (CN); Hejia Luo, Hangzhou (CN); Rong Li, Hangzhou (CN); Jun Wang, Hangzhou (CN)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 0 days.

(21) Appl. No.: 16/521,605

(22) Filed: Jul. 25, 2019

(65) Prior Publication Data
US 2019/0349004 A1 Nov. 14, 2019

Related U.S. Application Data

(63) Continuation of application No. PCT/CN2018/074026, filed on Jan. 24, 2018.

(30) Foreign Application Priority Data

Jan. 25, 2017 (CN) .......................... 201710056778.8

(51) Int. Cl.
*H03M 13/11* (2006.01)
*H04L 1/00* (2006.01)

(52) U.S. Cl.
CPC ...... *H03M 13/116* (2013.01); *H03M 13/1157* (2013.01); *H03M 13/1177* (2013.01);
(Continued)

(58) Field of Classification Search
CPC ........... H03M 13/116; H03M 13/1157; H03M 13/1177; H03M 13/618; H03M 13/6516;
(Continued)

(56) References Cited

U.S. PATENT DOCUMENTS

| 2006/0242534 A1 | 10/2006 | Livshitz |
| 2011/0283159 A1 | 11/2011 | Yuan et al. |
| 2019/0068224 A1* | 2/2019 | Li ........................ H03M 13/00 |

FOREIGN PATENT DOCUMENTS

| CN | 101141133 A | 3/2008 |
| CN | 101207386 A | 6/2008 |

(Continued)

OTHER PUBLICATIONS

N. George et al., "A channel coder design for a novel high speed communication system," 2014 International Conference on Advances in Electronics Computers and Communications, Bangalore, 2014, pp. 1-5. (Year: 2014).*

(Continued)

*Primary Examiner* — Cynthia Britt
(74) *Attorney, Agent, or Firm* — Kilpatrick Townsend & Stockton LLP

(57) ABSTRACT

An encoding method, an encoding apparatus, a decoding method, and a decoding apparatus are provided. The encoding method includes: determining a size of a shift matrix based on a length of an information sequence and a length of an identifier sequence; constructing a check matrix based on the size of the shift matrix and a base matrix; and performing low-density parity-check LDPC encoding on the information sequence and the identifier sequence based on the check matrix. The identifier sequence is a non-all-zero sequence. Because the encoded codeword includes information of the identifier sequence, a receive device can identify whether information corresponding to the encoded code- (Continued)

word is addressed to the receive device, thereby improving information processing efficiency in the transmission.

11 Claims, 6 Drawing Sheets

(52) U.S. Cl.
CPC .......... *H04L 1/0008* (2013.01); *H04L 1/0013* (2013.01); *H04L 1/0041* (2013.01); *H04L 1/0061* (2013.01)

(58) Field of Classification Search
CPC ............. H03M 13/6306; H04L 1/0008; H04L 1/0013; H04L 1/0041; H04L 1/0061; H04L 1/00; H04L 1/0045
See application file for complete search history.

(56) References Cited

FOREIGN PATENT DOCUMENTS

| | | |
|---|---|---|
| CN | 101662290 A | 3/2010 |
| CN | 101741396 A | 6/2010 |
| CN | 103346803 A | 10/2013 |
| EP | 2226945 A1 | 9/2010 |

OTHER PUBLICATIONS

3GPP TS 36.212 V14.1.1 (Jan. 2017);3rd Generation Partnership Project;Technical Specification Group Radio Access Network;Evolved Universal Terrestrial Radio Access (E-UTRA);Multiplexing and channel coding(Release 14);total 149 pages.

Nokia et al: "Padding for LDPC codes", 3GPP Draft; R1-1701031, vol. RAN WG1, No. Spokane, U.S.A.; Jan. 16, 2017—Jan. 20, 2017, Jan. 16, 2017, XP051208546, 4 pages.

Samsung: "Design of Flexible LDPC Codes", 3GPP Draft; R1-167889, vol. RAN WG1, No. Gothenburg, Sweden; Aug. 22, 2016-Aug. 26, 2016, Aug. 21, 2016, XP051142641, 6 pages.

* cited by examiner

ENCODING METHOD, DECODING METHOD, ENCODING APPARATUS, AND DECODING APPARATUS

CROSS-REFERENCE TO RELATED APPLICATIONS

This application is a continuation of International Application No. PCT/CN2018/074026, filed on Jan. 24, 2018, which claims priority to Chinese Patent Application No. 201710056778.8, filed on Jan. 25, 2017. The disclosures of the aforementioned applications are hereby incorporated by reference in their entireties.

TECHNICAL FIELD

Embodiments of the present disclosure relate to the field of communications technologies, and in particular, to an encoding method, a decoding method, an encoding apparatus, and a decoding apparatus.

BACKGROUND

A low-density parity-check (Low Density Parity Check, LDPC) code is a linear block code with a sparse check matrix that was proposed by Dr. Robert G. Gallager in 1963. The Low-density parity-check code not only has good performance of approaching a Shannon limit, but also has relatively low decoding complexity and a flexible structure, and therefore becomes a research hotspot in the field of channel encoding in recent years. Currently, the low-density parity-check code has been widely applied to fields such as deep space communication, optical fiber communication, satellite digital videos, and audio broadcasting. In a fifth-generation (the fifth generation, 5G) mobile communications system, encoding of a data channel of an Enhanced Mobile Broadband (Enhance Mobile Broadband, eMBB) service is well applied. A check matrix corresponding to a quasi-cyclic low-density parity-check (Quasi-Cyclic Low Density Parity Check, QC-LDPC) code constructed based on a base matrix (base graph) has simple-to-describe and easy-to-construct advantages and the like. A general form of such the matrix is shown in FIG. 2. FIG. 2 is a schematic diagram of an LDPC check matrix constructed based on a base matrix, and grid parts in the figure are locations of padding bits (padding bits). In the prior art, 0 is usually padded into redundant information bit locations, namely, the grid parts in the figure. This is a so-called zero-padding method. When a receive end performs decoding, 0 (if hard decoding is performed) or a soft value corresponding to 0 (if soft decoding is performed) is padded into a corresponding location for decoding. In this way, redundant information bits, namely, the padding bits, are not fully used.

SUMMARY

A technical problem to be resolved in embodiments of this application is to provide an encoding method, an encoding apparatus, a decoding method, and a decoding apparatus, so as to extend a function of an LDPC check matrix.

According to a first aspect, an embodiment of this application provides an encoding method. and The method may include:

Determining, by an encoder, a size of a shift matrix based on a length of an information sequence and a length of an identifier sequence;

Constructing, by the encoder, a check matrix based on the size of the shift matrix and a base matrix; and performing low-density parity-check (LDPC) encoding on the information sequence and the identifier sequence based on the check matrix; where the identifier sequence is a non-all-zero sequence.

Because the check matrix is constructed based on the information sequence and the identifier sequence, the check matrix includes information about the identifier sequence. The check matrix is used to encode the information sequence and the identifier sequence, so that an output encoded codeword includes the information about the identifier sequence, and when performing decoding, a receive end device more easily identifies whether information corresponding to the encoded codeword is information sent to the receive end device. In this way, an identification degree of the encoded codeword is higher, and information transmission pertinence in each scenario and information processing efficiency in a transmission process are improved. If performing encoding by using a terminal identifier sequence and the information sequence, when receiving information, the terminal may quickly determine that the information is sent to the terminal. If performing encoding by using a base station cell identifier sequence and the information sequence, when receiving information, the terminal may quickly determine whether the message is information that is sent by a cell and that needs to be received by the terminal, and does not process information sent by another cell. Therefore, information processing efficiency in a transmission process is improved.

In a possible implementation, the size of the shift matrix is determined according to the following formula: $Z=(K+L)/(n_b-m_b)$, where $Z$ is the size of the shift matrix, $K$ is the length of the information sequence, $L$ is the length of the identifier sequence, $n_b$ is a number of columns of the base matrix, and $m_b$ is a number of rows of the base matrix.

In a possible implementation, the identifier sequence is one of the following sequences: a sequence used to identify a transmit end device, a sequence used to identify a receive end device, a sequence used to identify a device group to which the transmit end device belongs, a sequence used to identify a device group to which the receive end device belongs, and a non-all-zero sequence agreed between the transmit end device and the receive end device by using signaling, where the transmit end device is a device that encodes the information sequence and the identifier sequence, and the receive end device is a device that receives an encoded information sequence and an encoded identifier sequence.

The identifier sequence may be a radio network temporary identifier, so as to help a decoder-side device to identify received information. Alternatively, the identifier sequence may be a physical cell identifier, so as to reduce inter-cell interference, enable a terminal to quickly determine whether received information belongs to the terminal, and reduce interference in the terminal from information that is sent by another cell and that does not belong to the terminal. Alternatively, the identifier sequence may be a device group identifier, so as to improve a degree of identifying information by devices in the entire group.

In a possible implementation, the check matrix includes redundant information bit locations, the identifier sequence is repeatedly padded (inserted) into the redundant information bit location in the check matrix; or an all-zero sequence or an all-one sequence is padded (inserted) into the redundant information bit locations in the check matrix.

When the identifier sequence is repeatedly padded into the redundant information bit location, an identification degree of an encoded codeword can be further improved.

According to a second aspect, an embodiment of this disclosure provides a decoding method, and the method may include:

Determining, by a decoder, a size of a shift matrix based on a length of an information sequence and a length of an identifier sequence;

Constructing, by the decoder, a check matrix based on the size of the shift matrix and a base matrix; and performing low-density parity-check LDPC decoding on received data based on the check matrix, where the received data includes information about the identifier sequence and information about the information sequence.

In a possible implementation, the size of the shift matrix is determined according to the following formula:

$Z=(K+L)/(n_b-m_b)$, where

Z is the size of the shift matrix, K is the length of the information sequence, L is the length of the identifier sequence, $n_b$ is a number of columns of the base matrix, and $m_b$ is a number of rows of the base matrix.

In a possible implementation, the identifier sequence is one of the following sequences: a sequence used to identify a transmit end device, a sequence used to identify a receive end device, a sequence used to identify a device group to which the transmit end device belongs, a sequence used to identify a device group to which the receive end device belongs, and a non-all-zero sequence agreed between the transmit end device and the receive end device by using signaling, where the transmit end device is a device that encodes the information sequence and the identifier sequence, and the receive end device is a device that receives an encoded information sequence and an encoded identifier sequence.

According to a third aspect, an embodiment of this disclosure provides an encoding apparatus, and the encoding apparatus may include:

a determining unit configured to determine a size of a shift matrix based on a length of an information sequence and a length of an identifier sequence;

a construction unit configured to construct a check matrix based on the size of the shift matrix and a base matrix; and an encoding unit configured to perform low-density parity-check LDPC encoding on the information sequence and the identifier sequence based on the check matrix; where the identifier sequence is a non-all-zero sequence.

In a possible implementation, the determining unit is configured to:

determine the size of the shift matrix according to the following formula:

$Z=(K+L)/(n_b-m_b)$, where

Z is the size of the shift matrix, K is the length of the information sequence, L is the length of the identifier sequence, $n_b$ is a number of columns of the base matrix, and $m_b$ is a number of rows of the base matrix.

In a possible implementation, the identifier sequence is one of the following sequences: a sequence used to identify a transmit end device, a sequence used to identify a receive end device, a sequence used to identify a device group to which the transmit end device belongs, a sequence used to identify a device group to which the receive end device belongs, and a non-all-zero sequence agreed between the transmit end device and the receive end device by using signaling, where the transmit end device is a device that encodes the information sequence and the identifier sequence, and the receive end device is a device that receives an encoded information sequence and an encoded identifier sequence.

In a possible implementation, the construction unit is further configured to:

when there is a redundant information bit location in the check matrix, repeatedly pad the identifier sequence into the redundant information bit location in the check matrix; or pad an all-zero sequence or an all-one sequence into the redundant information bit location in the check matrix.

According to a fourth aspect, an embodiment of this disclosure provides an encoding apparatus, and the encoding apparatus may include:

a processor, a memory, a transceiver, and a bus, where the processor, the memory, and the transceiver are connected through the bus, the memory is configured to store a set of program code, the transceiver is configured to receive and send information, and the processor is configured to invoke the program code stored in the memory to perform the following operations:

determining a size of a shift matrix based on a length of an information sequence and a length of an identifier sequence;

constructing a check matrix based on the size of the shift matrix and a base matrix; and performing low-density parity-check (LDPC) encoding on the information sequence and the identifier sequence based on the check matrix; where the identifier sequence is a non-all-zero sequence.

In a possible implementation, the processor is specifically configured to:

calculate the size of the shift matrix according to the following formula:

$Z=(K+L)/(n_b-m_b)$, where

Z is the size of the shift matrix, K is the length of the information sequence, L is the length of the identifier sequence, $n_b$ is a number of columns of the base matrix, and $m_b$ is a number of rows of the base matrix.

In a possible implementation, the identifier sequence is one of the following sequences: a sequence used to identify a transmit end device, a sequence used to identify a receive end device, a sequence used to identify a device group to which the transmit end device belongs, a sequence used to identify a device group to which the receive end device belongs, and a non-all-zero sequence agreed between the transmit end device and the receive end device by using signaling, where the transmit end device is a device that encodes the information sequence and the identifier sequence, and the receive end device is a device that receives an encoded information sequence and an encoded identifier sequence.

In a possible implementation, the processor is further configured to:

when there is a redundant information bit location in the check matrix, repeatedly pad the identifier sequence into the redundant information bit location in the check matrix; or pad an all-zero sequence or an all-one sequence into the redundant information bit location in the check matrix.

According to a fifth aspect, an embodiment of this disclosure provides a decoding apparatus, and the decoding apparatus may include:

a determining unit, configured to determine a size of a shift matrix based on a length of an information sequence and a length of an identifier sequence;

a construction unit, configured to construct a check matrix based on the size of the shift matrix and a base matrix; and a decoding unit, configured to perform low-density parity-check LDPC decoding on received data based on the check matrix, where the received data includes information about the identifier sequence and information about the information sequence.

In a possible implementation, the determining unit is specifically configured to:

determine the size of the shift matrix according to the following formula:

$$Z=(K+L)/(n_b-m_b),\text{ where}$$

Z is the size of the shift matrix, K is a length of the information sequence, L is a length of the identifier sequence, $n_b$ is a number of columns of the base matrix, and $m_b$ is a number of rows of the base matrix.

In a possible implementation, the identifier sequence is one of the following sequences: a sequence used to identify a transmit end device, a sequence used to identify a receive end device, a sequence used to identify a device group to which the transmit end device belongs, a sequence used to identify a device group to which the receive end device belongs, and a non-all-zero sequence agreed between the transmit end device and the receive end device by using signaling, where the transmit end device is a device that encodes the information sequence and the identifier sequence, and the receive end device is a device that receives an encoded information sequence and an encoded identifier sequence.

According to a sixth aspect, an embodiment of this disclosure provides a decoding apparatus, and the decoding apparatus may include:

a processor, a memory, a transceiver, and a bus, where the processor, the memory, and the transceiver are connected by using the bus, the memory is configured to store a set of program code, the transceiver is configured to receive and send information, and the processor is configured to invoke the program code stored in the memory, to perform the following operations:

determining a size of a shift matrix based on a length of an information sequence and a length of an identifier sequence;

constructing a check matrix based on the size of the shift matrix and a base matrix; and performing low-density parity-check LDPC decoding on received data based on the check matrix, where the received data includes information about the identifier sequence and information about the information sequence.

In a possible implementation, the processor is specifically configured to:

determine the size of the shift matrix according to the following formula:

$$Z=(K+L)/(n_b-m_b),\text{ where}$$

Z is the size of the shift matrix, K is a length of the information sequence, L is a length of the identifier sequence, $n_b$ is a number of columns of the base matrix, and $m_b$ is a number of rows of the base matrix.

In a possible implementation, the identifier sequence is one of the following sequences: a sequence used to identify a transmit end device, a sequence used to identify a receive end device, a sequence used to identify a device group to which the transmit end device belongs, a sequence used to identify a device group to which the receive end device belongs, and a non-all-zero sequence agreed between the transmit end device and the receive end device by using signaling, where the transmit end device is a device that encodes the information sequence and the identifier sequence, and the receive end device is a device that receives an encoded information sequence and an encoded identifier sequence.

According to a seventh aspect, an embodiment of this disclosure discloses a base station, and the base station may include:

the encoding apparatus according to any implementation of the third aspect of the embodiments of this disclosure and/or the decoding apparatus according to any implementation of the fifth aspect of the embodiments of this disclosure.

According to an eighth aspect, an embodiment of this disclosure discloses a terminal, and the terminal may include:

the encoding apparatus according to any implementation of the third aspect of the embodiments of this disclosure and/or the decoding apparatus according to any implementation of the fifth aspect of the embodiments of this disclosure.

According to a ninth aspect, a computer readable storage medium is provided, where the computer readable storage medium stores an instruction, and when the instruction is run on a computer, the computer performs the method according to the first aspect or any possible implementation of the first aspect.

According to a tenth aspect, a computer readable storage medium is provided, where the computer readable storage medium stores an instruction, and when the instruction is run on a computer, the computer performs the method according to the second aspect or any possible implementation of the second aspect.

According to an eleventh aspect, a computer program product including an instruction is provided, where when the computer program product is run on a computer, the computer performs the method according to the first aspect or any possible implementation of the first aspect.

According to a twelfth aspect, a computer program product including an instruction is provided, where when the computer program product is run on a computer, the computer performs the method according to the second aspect or any possible implementation of the second aspect.

BRIEF DESCRIPTION OF DRAWINGS

To describe the technical solutions in the embodiments of this disclosure or in the background more clearly, the following briefly describes the accompanying drawings required for describing the embodiments of this application or the background.

DESCRIPTION OF EMBODIMENTS

Figure 1:
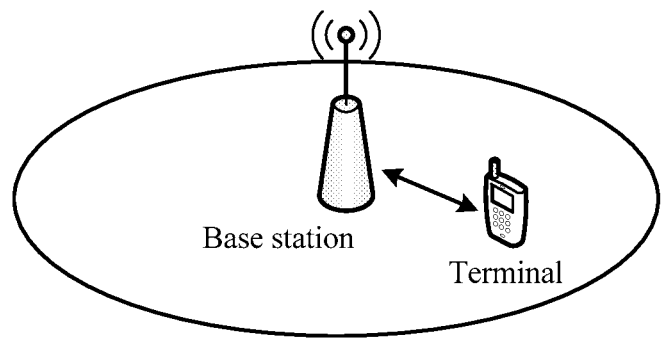
FIG. 1 is a schematic architectural diagram of a communications system according to an embodiment of the present disclosure.
Figure 2:
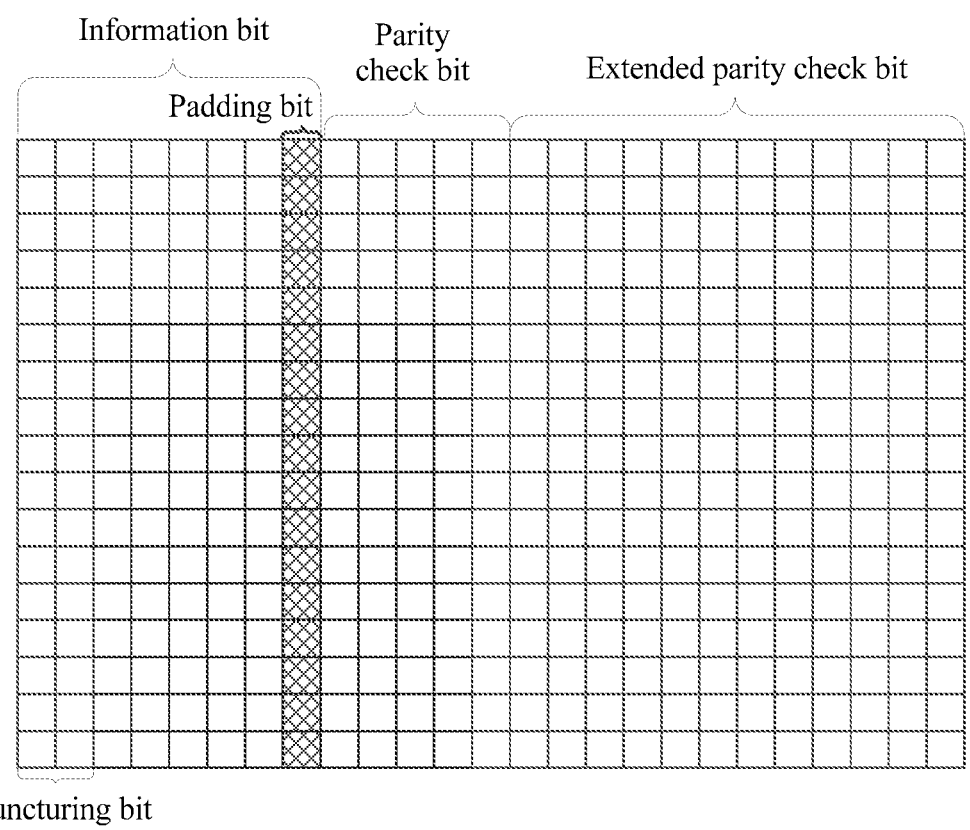
FIG. 2 is a schematic diagram of an LDPC check matrix constructed based on a base matrix that can be utilized in the present disclosure.

With continuous development of communications technologies, the service scope, the number of messages, and the number of terminals are rapidly increasing. In a future 5G communications system or a higher-level communications system, the message identification degree becomes increasingly important, because it can improve both information transmission pertinence and information processing efficiency in an information transmission process. A QC-LDPC code not only has good performance of approaching a Shannon limit, but also has relatively low decoding complexity and a flexible structure, and therefore becomes a research hotspot in the field of channel encoding in recent years. Currently, the QC-LDPC code has been widely applied to fields such as deep space communication, optical fiber communication, satellite digital videos, and audio broadcasting. For the QC-LDPC code, a final check matrix with a size of $m_b \cdot Z \times n_b \cdot Z$ may be represented by H, and a form of the check matrix may be:

$$H = \begin{bmatrix} P^{a_{11}} & P^{a_{12}} & \cdots & P^{a_{1n_b}} \\ P^{a_{21}} & P^{a_{22}} & \cdots & P^{a_{2n_b}} \\ \vdots & \vdots & \ddots & \vdots \\ P^{a_{m_b 1}} & P^{a_{m_b 2}} & \cdots & P^{a_{m_b n_b}} \end{bmatrix},$$

where $a_{ij}$ is a shift factor of a shift matrix, $n_b$ and $m_b$ are respectively the number of columns and the number of rows of a base matrix, and $P^{a_{ij}}$ is a shift matrix Z, and may be obtained by cyclically shifting an identity matrix I by $a_{ij}$, where a range of $a_{ij}$ is $-1 \le a_{ij} < Z$. An all-zero matrix O of $Z \times Z$ may be defined as $P^{-1}$, and Z is a size of the shift matrix. If H is a full rank matrix, $(n_b - m_b) \cdot Z$ information bits may be placed in a column of $(n_b - m_b)$ of the base matrix. The column of $k_b = (n_b - m_b)$ of the base matrix is referred to as an information column. When the QC-LDPC code is used, if a length K of an information sequence is exactly divided by $k_b$, each information bit location in an extended LDPC check matrix is used to place an information bit; or if K is not exactly divided by $k_b$, $Z \cdot k_b > K$, and there are $(Z \cdot k_b - K)$ redundant information bit locations in the extended LDPC check matrix, which may be referred to as padding bits. In a check matrix for constructing the QC-LDPC code, 0 is usually padded into redundant information bit locations in the check matrix, namely, padding bits (padding bits). In this way, the padding bits cannot be fully used.

The following describes embodiments of this disclosure with reference to the accompanying drawings. In the specification, claims, and accompanying drawings of this disclosure, the terms "first", "second", and the like are intended to distinguish between different objects but are not intended to describe a particular order. Moreover, the terms "include", "have", and any other variants thereof are intended to cover non-exclusive inclusion. For example, a process, a method, a system, a product, or a device that includes a series of steps or units is not limited to the listed steps or units, but optionally further includes a step or a unit that is not listed, or optionally further includes another inherent step or unit of the process, the method, the product, or the device.

FIG. 1 is a schematic architectural diagram of a communications system according to an embodiment of this disclosure. The communications system may include but is not limited to:

a base station and at least one terminal, where the terminal may also be referred to as user equipment (User Equipment, UE).

A transmit end device and a receive end device in the embodiments of this disclosure may be any transmit end device and any receive end device that transmit data wirelessly. The transmit end device and the receive end device may be any device having wireless receiving and sending functions, including but not limited to a NodeB (NodeB), an evolved NodeB (eNodeB), a base station in a fifth-generation (the fifth generation, 5G) communications system, a base station or a network device in a future communications system, an access node in a Wi-Fi system, a wireless relay node, a wireless backhaul node, and user equipment (user equipment, UE). The UE may also be referred to as a terminal (terminal), a mobile station (mobile station, MS), a mobile terminal (mobile terminal, MT), or the like. The UE may communicate with one or more core networks over a radio access network (radio access network, RAN), or may access a distributed network in a self-organizing or grant-free manner. The UE may further access a wireless network in another manner for communication, or the UE may directly perform wireless communication with another UE. This is not limited in the embodiments of this disclosure.

The transmit end device and the receive end device in the embodiments of this disclosure may be deployed on land such as indoor or outdoor devices, handheld devices, or vehicle-mounted devices, or may be deployed on the water, or may be deployed on an airplane, a balloon, or a satellite in space. The UE in the embodiments of this disclosure may be a mobile phone (mobile phone), a tablet computer (Pad), a computer having wireless receiving and sending functionality, a virtual reality (Virtual Reality, VR) terminal device, an augmented reality (Augmented Reality, AR) terminal device, a wireless terminal in industrial control (industrial control) systems, a wireless terminal in self driving (self-driving) vehicles, a wireless terminal in remote medical (remote medical) systems, a wireless terminal in smart grid (smart grid), a wireless terminal in transportation safety (transportation safety) systems, a wireless terminal in smart city (smart city), a wireless terminal in smart home (smart home), or the like. An application scenario is not limited in the embodiments of this disclosure.

The embodiments of this disclosure may be applied to downlink data transmission, or may be applied to uplink data transmission, or may be applied to device-to-device (device-to-device, D2D) data transmission. For the downlink data transmission, a sending device is a base station, and a corresponding receiving device is UE. For the uplink data transmission, a sending device is UE, and a corresponding receiving device is a base station. For the D2D data transmission, a sending device is UE, and a corresponding receiving device is also UE. The transmit end device and the receive end device in this disclosure may each include an encoding apparatus and/or a decoding apparatus, so that information that needs to be sent can be modulated and encoded, or received encoded information can be demodulated and decoded, thereby implementing information transmission between the transmit end device and the receive end device. This is not limited in the embodiments of this disclosure.

Figure 3:
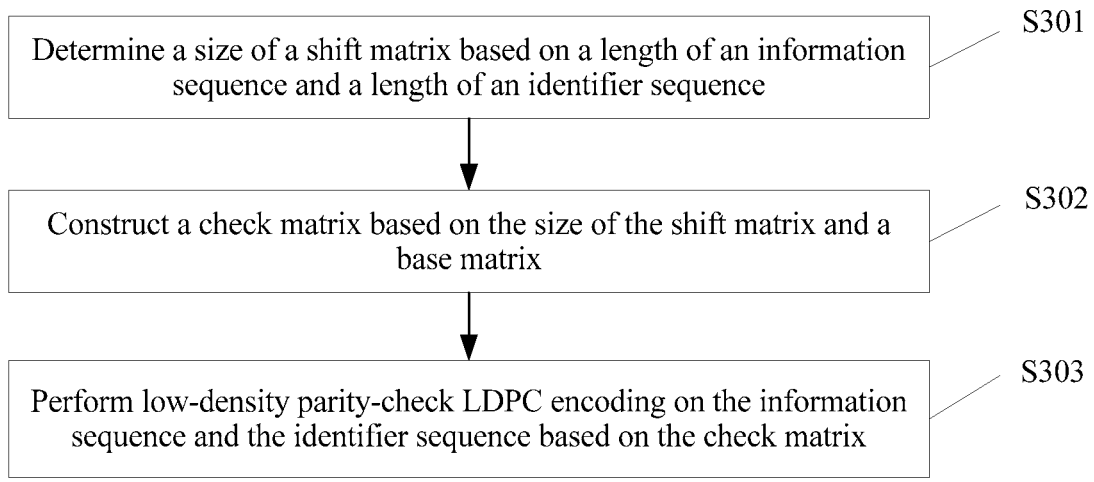
FIG. 3 is a schematic flowchart of an encoding method according to an embodiment of the present disclosure.

FIG. 3 shows an encoding method according to an embodiment of the present disclosure. The encoding method is implemented based on a QC-LDPC code, and includes but is not limited to the following steps.

S301. Determine, by a transmit end device (encoder device), a size of a shift matrix based on a length of an information sequence and a length of an identifier sequence.

The information sequence is a to-be-encoded binary sequence obtained after a transmit end device converts to-be-sent data, and the identifier sequence is a non-all-zero sequence, i.e., a binary data sequence having a digital pattern that is not all zeros.

In one embodiment, the identifier sequence is one of the following sequences: a sequence used to identify a transmit end device, a sequence used to identify a receive end device, a sequence used to identify a device group to which the transmit end device belongs, a sequence used to identify a device group to which the receive end device belongs, and a non-all-zero sequence agreed between the transmit end device and the receive end device by using signaling, where the transmit end device is a device that encodes the information sequence and the identifier sequence, and the receive end device is a device that receives an encoded information sequence and an encoded identifier sequence.

For example, when the transmit end device is a base station, the identifier sequence may be a physical cell identifier (physical cell identity, PCI), or a radio network temporary identifier (radio network temporary identity, RNTI) of a terminal that receives information sent by the base station, or an identifier of a device group to which a terminal that receives information sent by the base station belongs. When the transmit end device is a terminal, the identifier sequence may be an RNTI of the terminal, or an RNTI of a peer device, or a PCI of a base station that receives information sent by the terminal, or may be an identifier of a device group to which the terminal belongs.

After the length of the information sequence and the length of the identifier sequence are determined, the size of the shift matrix may be determined with reference to a base matrix based on a capacity requirement. After the size of the shift matrix is determined, a size of a shift factor may be further determined.

S302. Construct a check matrix based on the size of the shift matrix and a base matrix.

Herein, the check matrix may be constructed based on an existing algorithm, for example, the check matrix is obtained by determining the size of the shift factor based on the size of the shift matrix and then cyclically shifting the base matrix based on the shift factor, or the check matrix is jointly constructed with reference to another algorithm. This is not limited in this embodiment of this disclosure. The shift factor may also be referred to as an extension factor.

Early research on an LDPC code mainly focuses on a performance field, and a constructed codeword usually has relatively high encoding and decoding complexity and requires a relatively large amount of storage space. Consequently, application of the codeword in an actual system is limited to some extent. In recent years, due to the emergence of a QC-LDPC code, encoding and decoding complexity is effectively reduced, and only a relatively small amount of storage space is required. In addition, the right part of the check matrix is designed to be in a form of a double diagonal or a triple diagonal, so that the check matrix can directly generate an LDPC code, thereby omitting an intermediate process of obtaining a generation matrix, and further reducing encoding complexity.

In one embodiment, when the check matrix is constructed, after information about the information sequence and the identifier sequence has been added to information bit locations of the check matrix, there may be one or more redundant information bits, namely, padding bits. In this case, the identifier sequence may be repeatedly padded (inserted) into the redundant information bit locations of the check matrix, or an all-zero sequence or an all-one sequence are padded (inserted) into the redundant information bit locations of the check matrix.

S303. Perform low-density parity-check LDPC encoding on the information sequence and the identifier sequence based on the check matrix.

After a check matrix H is determined, the check matrix H may be converted into a generation matrix G by using a Gaussian elimination method or another method, and then an encoded codeword is generated according to u·G=c, where u is an input of the information sequence and the identifier sequence, and c is the encoded codeword.

Alternatively, a value of each coded bit in the encoded codeword c may be determined according to $Hc^T=0$ by resolving a system of linear equations.

Because the check matrix in this embodiment is constructed based on the information sequence and the identifier sequence, the check matrix includes information about the identifier sequence. The check matrix is used to encode the information sequence and the identifier sequence, so that an identification degree of an output encoded codeword is higher, and information transmission pertinence in various scenarios and information processing efficiency in a transmission process are improved.

For example, an RNTI may be used as an identifier of the terminal, and a PCI may be used as an identifier of a base station cell. When some base stations send information to a device group including a plurality of terminals, the identifier sequence may also be a device group identifier sequence. In addition, for the transmit end device, for example, the base station sends downlink information to the terminal, the terminal sends uplink information to the base station. In a scenario in which terminals communicate with each other, both an identifier sequence of the transmit end device and an identifier sequence of the receive end device may be added to the check matrix, to improve an identification degree of the encoded codeword. This is not limited in this embodiment of this disclosure. For devices in one group, a plurality of devices in the group may directly share one device group identifier sequence, and the base station adds the device group identifier sequence to the check matrix. If all the devices in the group know identifier sequences of each other, the base station may add, in an agreed sequence, identifier sequences of two or more devices in the group when sending information to the device group. Certainly, for two or more terminals that are not in the group but know identifier sequences of the other terminals, the base station may also add the identifier sequences of the two or more terminals to the check matrix in the agreed sequence.

When the check matrix includes an RNTI sequence, an output encoded codeword is easily identified. Therefore, when a decoder side device performs decoding, because only a target user knows the identifier sequence, the decoder side device may more reliably determine, based on a check result of a check equation of $Hc^T=0$, whether a received message belongs to the target user, so as to help the decoder side device to identify the received information. H is the check matrix, c is a codeword obtained after the decoding, and the superscript T denotes the transpose of the matrix.

When the check matrix includes a PCI sequence, inter-cell interference may be reduced, so as to help the terminal to quickly determine whether received information belongs to the terminal, and reduce interference in the terminal from information that is sent by another cell and that does not belong to the terminal.

In addition, in some scenarios in which blind detection needs to be performed, for example, in an ultra-reliable and low latency communications (ultra-reliable &low latency communication, URLLC) scenario or a grant-free (grant-free) access scenario, a blind detection process is accelerated by placing a specific identifier sequence into the check matrix. If there are potentially a plurality of users who simultaneously send information on a same time-frequency resource, a decoder side may compare check results of $Hc^T$ to determine users that are potential users, so as to narrow a target user range. If one user may place information at a plurality of locations, information about the plurality of locations may be decoded, and only information that meets a requirement of $Hc^T$ may be further decoded, so as to shorten decoding latency.

Figure 4:
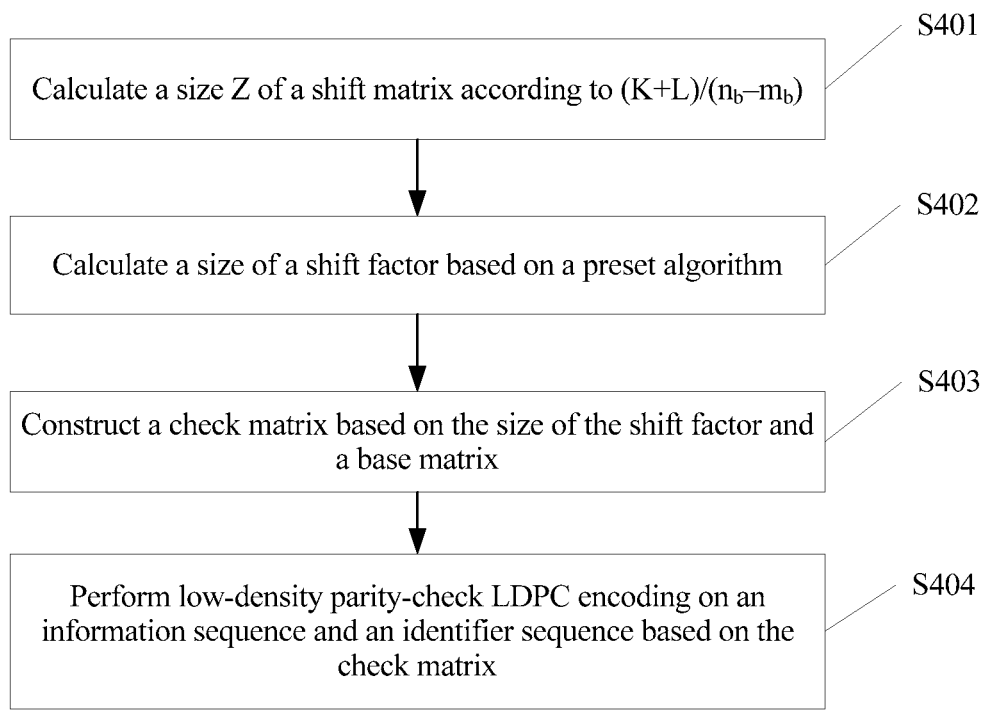
FIG. 4 is a schematic flowchart of another encoding method according to an embodiment of the present disclosure.

FIG. 4 shows another encoding method according to an embodiment of the present disclosure. Steps S403 and S404 in the encoding method are the same as S302 and S303 in FIG. 3, and details are not described herein again. In this embodiment, steps of determining a size of a shift matrix and determining a size of a shift factor are described in detail below:

S401. Calculate the size Z of the shift matrix according to $(K+L)/(n_b-m_b)$.

Because the number $n_b$ of columns of a base matrix and the number $m_b$ of rows of the base matrix are known, to ensure that a check matrix can accommodate an information sequence and an identifier sequence, the size Z of the shift matrix may be determined according to $(K+L)/(n_b-m_b)$. Z is the size of the shift matrix, K is a length of the information sequence, L is a length of the identifier sequence, $n_b$ is the quantity of columns of the base matrix, and $m_b$ is the quantity of rows of the base matrix.

S402. Calculate the size of the shift factor based on a preset algorithm.

A matrix constituted by the shift factor may be defined as:

$$E(H) = \begin{bmatrix} a_{12} & a_{12} & \cdots & a_{1n_b} \\ a_{21} & a_{22} & \cdots & a_{2n_b} \\ \vdots & \vdots & \ddots & \vdots \\ a_{m_b1} & a_{m_b2} & \cdots & a_{m_bn_b} \end{bmatrix}$$

which is $E(H_Z)=(a_{ij})$ for short, where $H_Z$ is a check matrix with the size of the shift matrix: $Z \times Z$.

In one embodiment, the size of the shift factor may be calculated according to the following formula:

$$a_{ij} = \begin{cases} a_{ij}, & a_{ij} < 0 \\ a_{ij_{max}} \bmod Z, & a_{ij} \geq 0 \end{cases},$$

where
$a_{ij_{max}}$ represents a shift factor corresponding to a maximum shift matrix $Z_{max}$, and mod represents a modulo operation.

It should be noted that when $a_{ij}<0$, namely, $a_{ij}=-1$, a shift matrix $P^{-1}$ is a zero matrix.

Alternatively, the size of the shift factor may be calculated according to the following formula:

$$a^{ij} = \begin{cases} H_{Z_{max}}(i, j), & \text{if } H_{Z_{max}}(i, j) < Z \\ \left\lfloor \dfrac{H_{Z_{max}}(i, j)}{2^t} \right\rfloor, & \text{otherwise} \end{cases},$$

where
t is a base matrix corresponding to the maximum shift matrix $Z_{max}$, and $t=\lceil Z_{max}/Z \rceil \cdot H_{Z_{max}}(i,j)$. $H_{Z_{max}}$ is a check matrix corresponding to $Z_{max}$, and $H_{Z_{max}}(i,j)$ is an element value corresponding to an $i^{th}$ row and a $j^{th}$ column of the check matrix $H_{Z_{max}}(i,j)$.

After the size of the shift factor is determined, the check matrix may be constructed with reference to the base matrix.

In this embodiment, a solution of determining the size of the shift matrix and two solutions of determining the size of the shift factor are provided. Because the size of the shift matrix is determined based on both the length of the information sequence and the length of the identifier sequence, it can be ensured that the check matrix constructed based on the shift factor corresponding to the shift matrix can accommodate information about the information sequence and the identifier sequence.

For the encoding methods in the foregoing embodiments in FIG. 3 and FIG. 4, system encoding and decoding performance may be verified through emulation.

Figure 5:
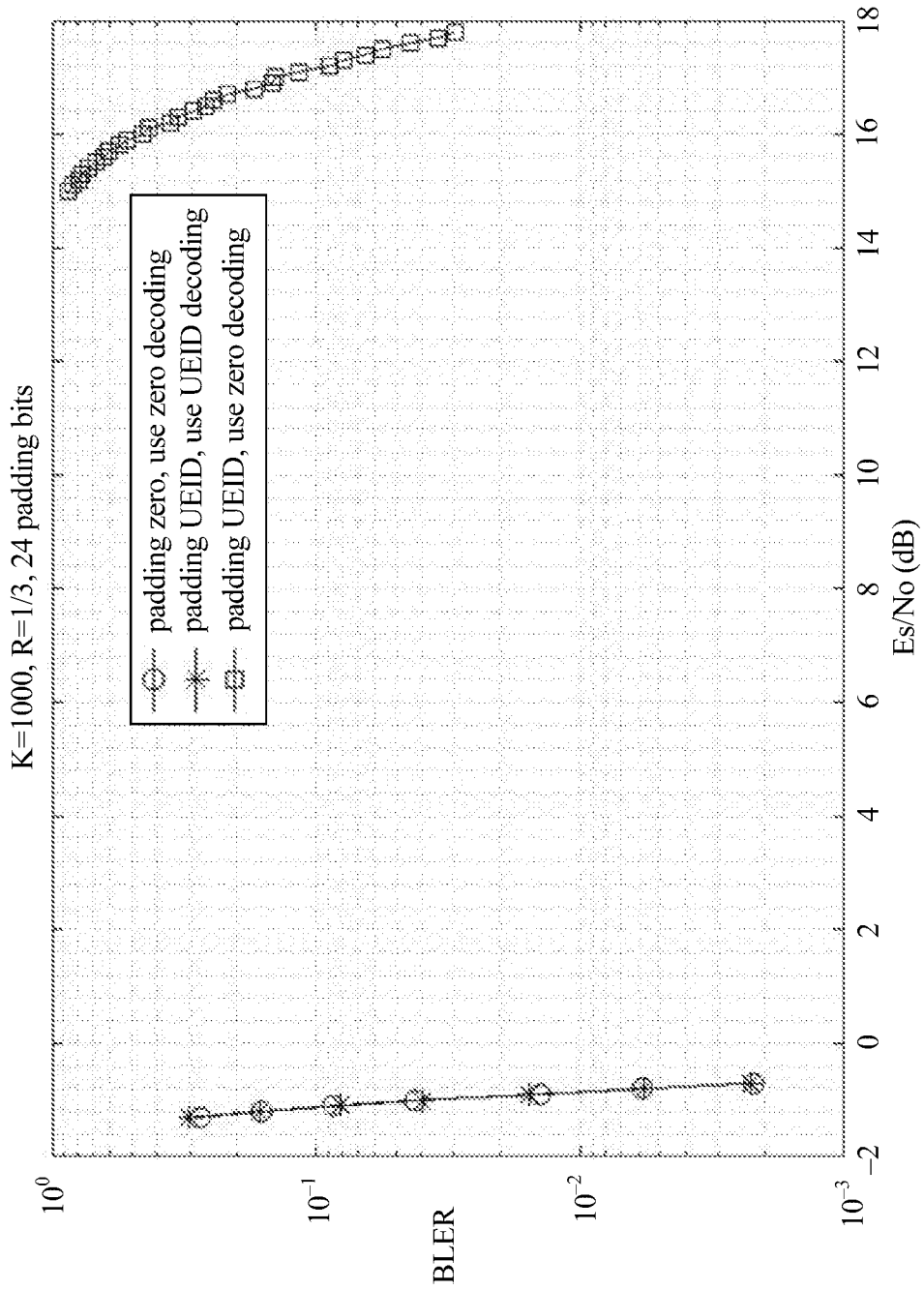
FIG. 5 is a performance test diagram of padding different sequences into a padding bit in a check matrix and performing decoding by using different sequences.
Figure 6:
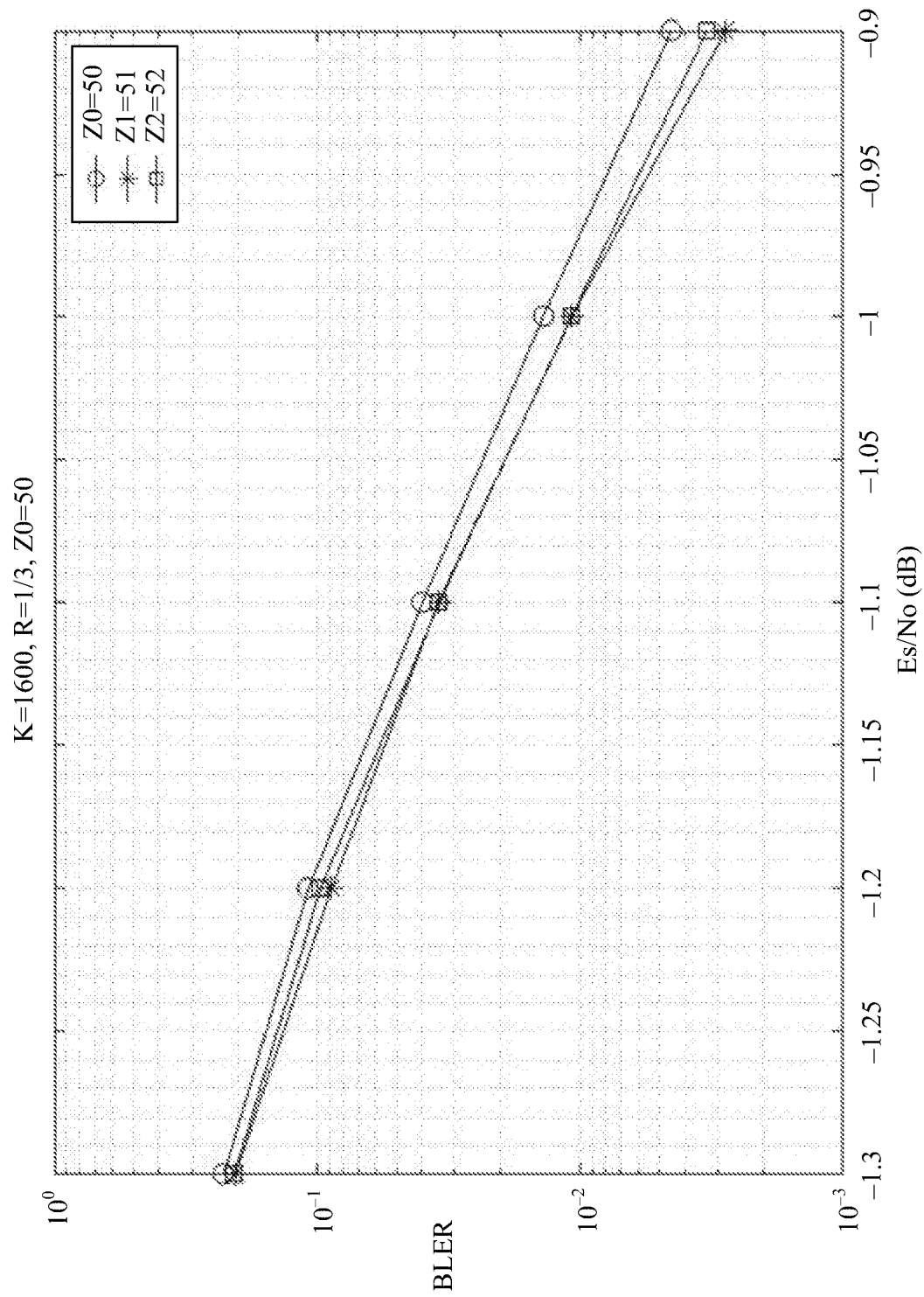
FIG. 6 is a performance test diagram before and after a padding bit of a check matrix is added.

For details, refer to FIG. 5 and FIG. 6. FIG. 5 is a performance test diagram of padding (inserting) different sequences into padding bits in a check matrix and performing decoding by using different sequences. For example, a zero sequence may be padded, or the identifier sequence in the embodiments in FIG. 3 and FIG. 4 may be padded. When the identifier sequence is padded, the check matrix is the same as the check matrix that is constructed after the size of the shift matrix is determined based on the length of the information sequence and the length of the identifier sequence in this embodiment.

As shown in FIG. 5, a length K, namely, a code length, of the information sequence is 1000, a code rate R is equal to ⅓, there are 24 padding bits in the check matrix, and a horizontal coordinate Es/No is a symbol signal-to-noise ratio and a vertical coordinate is a block error rate (BLER) in the figure. A curve marked with circles is a common schematic diagram of an effect of using a zero sequence for padding and using a zero sequence for decoding, and a curve marked with asterisks is a schematic diagram of an effect of using an identifier sequence such as an RNTI or a PCI for padding and using a corresponding identifier sequence for decoding. It may be seen that the foregoing two curves basically overlap, in other words, using the encoding method in this embodiment of this disclosure does not cause any loss to system performance. However, a curve marked with squares is a schematic diagram of an effect of using a zero sequence for padding and using an identifier sequence for decoding. Neither a block error rate nor a symbol signal-to-noise ratio is satisfactory, and a system performance loss is relatively high.

FIG. 6 is a performance test diagram before and after padding bits in a check matrix are added. The check matrix constructed in the embodiments in FIG. 3 and FIG. 4 is the same as a check matrix obtained after padding bits are added to and an identifier sequence is padded into an existing check matrix.

Figure 7:
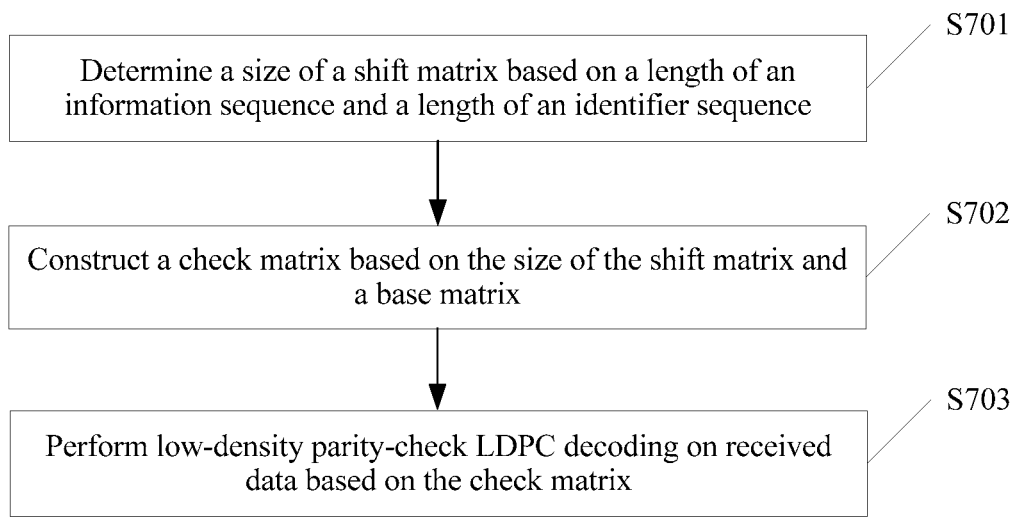
FIG. 7 is a schematic flowchart of a decoding method according to an embodiment of the present disclosure.

As shown in FIG. 6, a length K of an information sequence is 1600, a code rate R is equal to ⅓, a size of a shift matrix: Z0 is equal to 50, and an information column $k_b$ is 1600/50, namely, 32. In this case, there is no padding bit. A horizontal coordinate Es/No is a symbol signal-to-noise ratio and a vertical coordinate is a block error rate in the figure. After Z0 is increased to obtain Z1: 51 and Z2: 52, there are 32 padding bits in a check matrix corresponding to Z1, and there are 64 padding bits in a check matrix corresponding to Z2. In FIG. 7, a curve with a circle is a schematic diagram of an effect generated when Z0 is equal to 50, a curve with an asterisk is a schematic diagram of an effect generated when Z1 is equal to 51, and a curve with a square block is a schematic diagram of an effect generated when Z2 is equal to 52. It may be seen that the foregoing three curves basically overlap, and a larger value of Z leads to a larger check matrix and a larger generated codeword distance. Therefore, system performance is relatively good.

FIG. 7 shows a decoding method according to an embodiment of the present disclosure. The decoding method includes but is not limited to the following steps.

S701. Determine a size of a shift matrix based on a length of an information sequence and a length of an identifier sequence.

In one embodiment, the size of the shift matrix may be determined according to the following formula:

$Z=(K+L)/(n_b-m_b)$, where

Z is the size of the shift matrix, K is the length of the information sequence, L is the length of the identifier sequence, $n_b$ is the number of columns of the base matrix, and $m_b$ is the number of rows of the base matrix.

S702. Construct a check matrix based on the size of the shift matrix and a base matrix.

For the description of the foregoing method for determining the shift matrix and constructing the check matrix, refer to the description in the embodiment shown in FIG. 3. Details are not described herein again.

S703. Perform low-density parity-check LDPC decoding on received data based on the check matrix.

The received data include information about the identifier sequence and information about the information sequence.

When decoding is performed, soft information or hard information corresponding to the identifier sequence may be padded into a location corresponding to a padding bit in the check matrix, and then iterative decoding is performed with reference to the check matrix into which the soft information or the hard information is padded, and an information receiving sequence into which the soft information is padded.

In this case, when different types of information about the identifier sequence such as the hard information or the soft information is padded, hard decoding and soft decoding are respectively performed. The hard decoding is performed through a hard decision, and a demodulator directly makes a decision on a received signal waveform based on a decision threshold, and then outputs 0 or 1, in other words, each code element provided by the demodulator for a decoder for decoding only has two values: 0 or 1. Performing decoding by using a Hamming distance between sequences as a measurement may be applied to a binary symmetric channel. However, the soft decoding is performed through a soft decision, and the demodulator does not make a decision but directly outputs an analog parameter, or the demodulator performs multi-level quantization (instead of simple two-level quantization of 0 and 1) on an output waveform and then sends the output waveform to the decoder. In other words, an output of an encoding channel is "soft information" on which no decision is made. A soft decision decoder performs decoding by using a Euclidean distance as a measurement. A "soft distance" instead of the Hamming distance is used as a path measurement of a soft decision decoding algorithm, and the Euclidean distance, namely, a geometrical distance between a receiving waveform and a possible sending waveform, is most frequently used, which is a decoding method suitable for a discrete memoryless channel.

For a digital circuit, the hard decision is implemented by intercepting a sign bit of a demodulation quantization signal, and may be considered as one-level quantization, and the soft decision may be considered as a multi-level quantization that includes a high-order sign bit and a significant bit of channel information. The soft decision avoids an error decision generated after the demodulation, and a soft decision result is directly sent to the decoder for decoding. Generally, compared with the soft decision decoding, the hard decision decoding is simpler and is more easily implemented. However, because information about a channel output signal is fully used during the soft decision decoding, performance may be better by 2 dB to 3 dB.

In one embodiment, the received data may be decoded based on a message passing (message passing algorithms, MP) algorithm.

Certainly, in this case, a frequently used error back propagation (error back propagation, BP) learning algorithm, a confidence propagation algorithm, a min-sum algorithm, or the like may be selected for decoding. This is not limited in this embodiment of this disclosure.

When a decoding result meets a check equation of $Hc^T=0$, the decoding is completed.

H is the check matrix, and the size of the shift matrix corresponding to the check matrix is determined based on the length of the information sequence and the length of the identifier sequence. The identifier sequence is a non-all-zero sequence, c is a codeword obtained after the decoding, and the superscript T denotes the transpose of the matrix.

In this case, c is changing, and c changes once each time an iteration occurs, i.e., c changes with each iteration.

Certainly, in addition to stopping the decoding after the check equation is satisfied, the decoding may also be stopped when a maximum quantity of iteration times is reached when the message passing algorithm is used.

In one embodiment, the identifier sequence is one of the following sequences: a sequence used to identify a transmit end device, a sequence used to identify a receive end device, a sequence used to identify a device group to which the transmit end device belongs, a sequence used to identify a device group to which the receive end device belongs, and a non-all-zero sequence agreed between the transmit end device and the receive end device by using signaling, where the transmit end device is a device that encodes the information sequence and the identifier sequence, and the receive end device is a device that receives an encoded information sequence and an encoded identifier sequence.

For example, the identifier sequence may be a radio network temporary identifier sequence, a physical layer cell identifier sequence, or a device group identifier sequence.

The method in the embodiments of this disclosure is described above in detail, and the following describes an apparatus in the embodiments of this disclosure.

Figure 8:
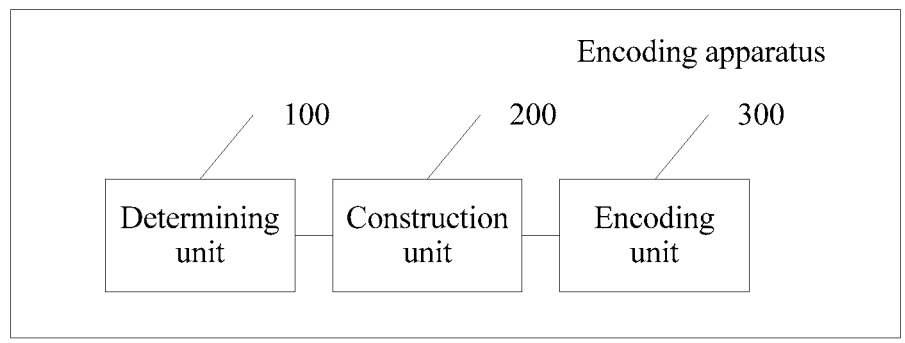
FIG. 8 is a schematic block diagram of an encoding apparatus according to an embodiment of the present disclosure.

FIG. 8 is a schematic diagram of an encoding apparatus according to an embodiment of the present disclosure. The encoding apparatus may include a determining unit 100, a construction unit 200, and an encoding unit 300. Detailed descriptions of the units are as follows:

The determining unit 100 is configured to determine a size of a shift matrix based on a length of an information sequence and a length of an identifier sequence.

The construction unit 200 is configured to construct a check matrix based on the size of the shift matrix and a base matrix.

The encoding unit 300 is configured to perform low-density parity-check LDPC encoding on the information sequence and the identifier sequence based on the check matrix.

The identifier sequence is a non-all-zero sequence.

In one embodiment, the determining unit 100 is specifically configured to:

calculate the size of the shift matrix according to the following formula:

$Z=(K+L)/(n_b-m_b)$, where

Z is the size of the shift matrix, K is the length of the information sequence, L is the length of the identifier sequence, $n_b$ is a quantity of columns of the base matrix, and $m_b$ is a quantity of rows of the base matrix.

After the size of the shift matrix is determined, a size of a shift factor may be determined.

A matrix constituted by the shift factor is:

$$E(H) = \begin{bmatrix} a_{12} & a_{12} & \cdots & a_{1n_b} \\ a_{21} & a_{22} & \cdots & a_{2n_b} \\ \vdots & \vdots & \ddots & \vdots \\ a_{m_b1} & a_{m_b2} & \cdots & a_{m_bn_b} \end{bmatrix}$$

which is $E(H_Z)=(a_{ij})$ for short, where $H_Z$ is a check matrix with the size of the shift matrix: Z×Z.

The size of the shift factor is calculated according to the following formula:

$$a_{ij} = \begin{cases} a_{ij}, & a_{ij} < 0 \\ a_{ij_{max}} \bmod Z, & a_{ij} \geq 0 \end{cases},$$

where $a_{ij_{max}}$ represents a shift factor corresponding to a maximum shift matrix $Z_{max}$, and mod represents a modulo operation.

In one embodiment, the determining unit 100 may further determine the size of the shift factor in the following manner:

A matrix constituted by the shift factor is:

$$E(H) = \begin{bmatrix} a_{12} & a_{12} & \cdots & a_{1n_b} \\ a_{21} & a_{22} & \cdots & a_{2n_b} \\ \vdots & \vdots & \ddots & \vdots \\ a_{m_b1} & a_{m_b2} & \cdots & a_{m_bn_b} \end{bmatrix}$$

which is $E(H_Z)=(a_{ij})$ for short, where $H_Z$ is a check matrix with the size of the shift matrix: Z×Z.

The size of the shift factor is calculated according to the following formula:

$$a_{ij} = \begin{cases} H_{Z_{max}}(i,j), & \text{if } H_{Z_{max}}(i,j) < Z \\ \left\lfloor \dfrac{H_{Z_{max}}(i,j)}{2^t} \right\rfloor, & \text{otherwise} \end{cases},$$

where t is a base matrix corresponding to the maximum shift matrix $Z_{max}$, and $t=\lceil Z_{max}/Z \rceil \cdot H_{Z_{max}}(i,j)$. $H_{Z_{max}}$ is a check matrix corresponding to $Z_{max}$, and $H_{Z_{max}}(i,j)$ is an element value corresponding to an $i^{th}$ row and a $j^{th}$ column of the check matrix $H_{Z_{max}}(i,j)$.

In one embodiment, the identifier sequence is one of the following sequences: a sequence used to identify a transmit end device, a sequence used to identify a receive end device, a sequence used to identify a device group to which the transmit end device belongs, a sequence used to identify a device group to which the receive end device belongs, and a non-all-zero sequence agreed between the transmit end device and the receive end device by using signaling, where the transmit end device is a device that encodes the information sequence and the identifier sequence, and the receive end device is a device that receives an encoded information sequence and an encoded identifier sequence.

In one embodiment, the identifier sequence is a radio network temporary identifier sequence, a physical layer cell identifier sequence, or a device group identifier sequence.

In one embodiment, the construction unit 200 is further configured to:

when there is a redundant information bit location in the check matrix, repeatedly pad the identifier sequence into the redundant information bit location in the check matrix; or pad an all-zero sequence or an all-one sequence into the redundant information bit location in the check matrix.

It should be noted that for implementation of each unit, refer to the corresponding descriptions in the method embodiments shown in FIG. 3 and FIG. 4.

The encoding apparatus in this embodiment of this disclosure may exist independently, or may be integrated into a base station or a terminal.

Figure 9:
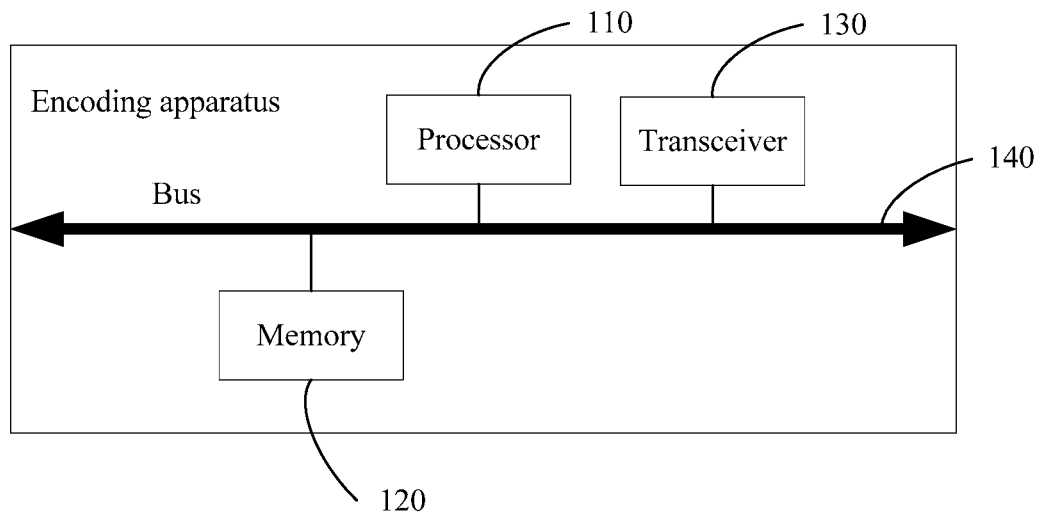
FIG. 9 is a schematic block diagram of an encoding apparatus according to another embodiment of the present disclosure.

FIG. 9 is a schematic diagram of an encoding apparatus (also referred to as encoder device or encoder) according to another embodiment of the present disclosure. The encoding apparatus may include a processor 110, a memory 120, a transceiver 130, and a bus 140, and the processor 110, the memory 120, and the transceiver 130 are connected by using the bus 140. Detailed descriptions of the units are as follows:

The memory 120 includes but is not limited to a random access memory (Random Access Memory, RAM), a read-only memory (Read-Only Memory, ROM), an erasable programmable read-only memory (Erasable Programmable Read-Only Memory, EPROM), or a portable read-only memory (Compact Disc Read-Only Memory, CD-ROM).

The memory 120 is configured to store a set of program code and related data. The transceiver 130 is configured to receive and send information.

The processor 110 may be one or more central processing units (Central Processing Unit, CPU). When the processor 110 is one CPU, the CPU may be a single-core CPU, or may be a multi-core CPU.

The processor 110 in the encoding apparatus is configured to read the program code stored in the memory 120, to perform the following operations:

determining a size of a shift matrix based on a length of an information sequence and a length of an identifier sequence;

constructing a check matrix based on the size of the shift matrix and a base matrix; and performing low-density parity-check LDPC encoding on the information sequence and the identifier sequence based on the check matrix; where the identifier sequence is a non-all-zero sequence.

In one embodiment, the processor 110 is specifically configured to:

calculate the size of the shift matrix according to the following formula:

$Z=(K+L)/(n_b-m_b)$, where

Z is the size of the shift matrix, K is the length of the information sequence, L is the length of the identifier sequence, $n_b$ is the number of columns of the base matrix, and $m_b$ is the number of rows of the base matrix.

Then, a size of a shift factor may be further determined in the following manner: A matrix constituted by the shift factor is:

$$E(H) = \begin{bmatrix} a_{12} & a_{12} & \cdots & a_{1n_b} \\ a_{21} & a_{22} & \cdots & a_{2n_b} \\ \vdots & \vdots & \ddots & \vdots \\ a_{m_b1} & a_{m_b2} & \cdots & a_{m_bn_b} \end{bmatrix}$$

which is $E(H_Z)=(a_{ij})$ for short, where $H_Z$ is a check matrix with the size of the shift matrix: $Z \times Z$.

The size of the shift factor is calculated according to the following formula:

$$a_{ij} = \begin{cases} a_{ij}, & a_{ij} < 0 \\ a_{ij_{max}} \bmod Z, & a_{ij} \geq 0 \end{cases},$$

where $a_{ij_{max}}$ represents a shift factor corresponding to a maximum shift matrix $Z_{max}$, and mod represents a modulo operation.

In one embodiment, another manner of determining the shift factor is as follows:

determining the size Z of the shift matrix based on the length K of the information sequence and the length L of the identifier sequence.

A matrix constituted by the shift factor is:

$$E(H) = \begin{bmatrix} a_{12} & a_{12} & \cdots & a_{1n_b} \\ a_{21} & a_{22} & \cdots & a_{2n_b} \\ \vdots & \vdots & \ddots & \vdots \\ a_{m_b1} & a_{m_b2} & \cdots & a_{m_bn_b} \end{bmatrix}$$

which is $E(H_Z)=(a_{ij})$ for short, where $H_Z$ is a check matrix with the size of the shift matrix: $Z \times Z$.

The size of the shift factor is calculated according to the following formula:

$$a^{ij} = \begin{cases} H_{Z_{max}}(i,j), & \text{if } H_{Z_{max}}(i,j) < Z \\ \left\lfloor \dfrac{H_{Z_{max}}(i,j)}{2^t} \right\rfloor, & \text{otherwise} \end{cases},$$

where t is a base matrix corresponding to the maximum shift matrix $Z_{max}$, and $t=\lceil Z_{max}/Z \rceil \cdot H_{Z_{max}}(i,j)$. $H_{Z_{max}}$ is a check matrix corresponding to $Z_{max}$, and $H_{Z_{max}}(i,j)$ is an element value corresponding to an $i^{th}$ row and a $j^{th}$ column of the check matrix $H_{Z_{max}}(i,j)$.

In one embodiment, the identifier sequence is one of the following sequences: a sequence used to identify a transmit end device, a sequence used to identify a receive end device, a sequence used to identify a device group to which the transmit end device belongs, a sequence used to identify a device group to which the receive end device belongs, and a non-all-zero sequence agreed between the transmit end device and the receive end device by using signaling, where the transmit end device is a device that encodes the information sequence and the identifier sequence, and the receive end device is a device that receives an encoded information sequence and an encoded identifier sequence.

Optionally, the identifier sequence is a radio network temporary identifier sequence, a physical layer cell identifier sequence, or a device group identifier sequence.

The processor 110 is further configured to:

when there is a redundant extra information bit location in the check matrix, repeatedly pad the identifier sequence into the redundant information bit location in the check matrix; or pad an all-zero sequence or an all-one sequence into the redundant information bit location in the check matrix.

It should be noted that for implementation of each operation, refer to the corresponding descriptions in the method embodiments shown in FIG. 3 and FIG. 4.

Figure 10:
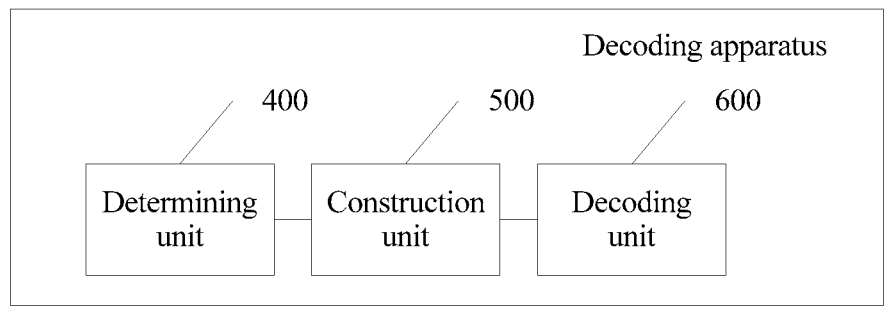
FIG. 10 is a schematic block diagram of a decoding apparatus according to an embodiment of the present disclosure.

FIG. 10 is a schematic diagram of a decoding apparatus (also referred to as decoding device or decoder) according to an embodiment of the present disclosure. The decoding apparatus may include:

a determining unit 400 configured to determine a size of a shift matrix based on a length of an information sequence and a length of an identifier sequence;

a construction unit 500 configured to construct a check matrix based on the size of the shift matrix and a base matrix; and a decoding unit 600 configured to perform low-density parity-check LDPC decoding on received data based on the check matrix, where the received data includes information about the identifier sequence and information about the information sequence.

The determining unit 400 is configured to:

determine the size of the shift matrix according to the following formula:

$Z=(K+L)/(n_b-m_b)$, where

Z is the size of the shift matrix, K is the length of the information sequence, L is the length of the identifier sequence, $n_b$ is the number of columns of the base matrix, and $m_b$ is the number of rows of the base matrix.

In one embodiment, the identifier sequence is one of the following sequences: a sequence used to identify a transmit end device, a sequence used to identify a receive end device, a sequence used to identify a device group to which the transmit end device belongs, a sequence used to identify a device group to which the receive end device belongs, and a non-all-zero sequence agreed between the transmit end device and the receive end device by using signaling, where the transmit end device is a device that encodes the information sequence and the identifier sequence, and the receive end device is a device that receives an encoded information sequence and an encoded identifier sequence.

In one embodiment, the identifier sequence is a radio network temporary identifier sequence, a physical layer cell identifier sequence, or a device group identifier sequence.

It should be noted that for implementation of each unit, refer to the corresponding descriptions in the method embodiment shown in FIG. 7.

The decoding apparatus in this embodiment of the present disclosure may exist independently, or may be integrated into a base station or a terminal.

Figure 11:
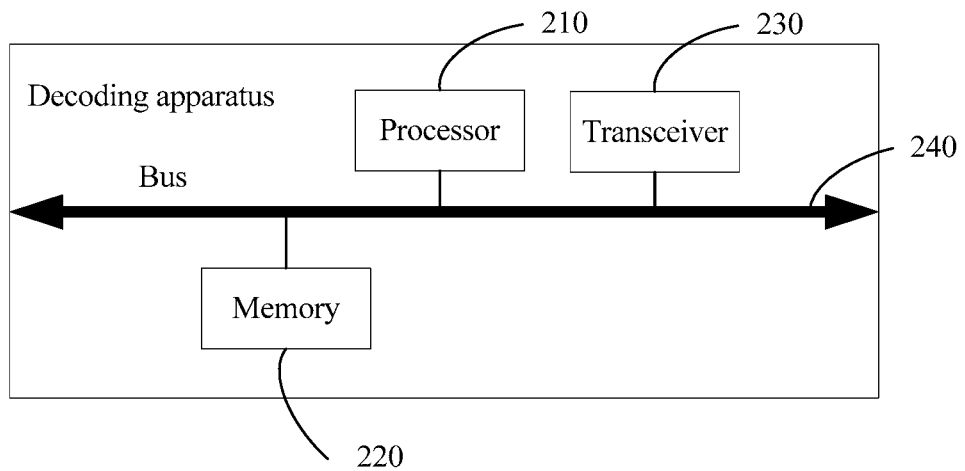
FIG. 11 is a schematic block diagram of an decoding apparatus according to another embodiment of the present disclosure.

FIG. 11 is a schematic diagram of a decoding apparatus (also referred to as decoding device or decoder) according to another embodiment of the present disclosure. The decoding apparatus may include a processor 210, a memory 220, a transceiver 230, and a bus 240, and the processor 210, the memory 220, and the transceiver 230 are connected by using the bus 240. Detailed descriptions of the units are as follows:

The memory 220 includes but is not limited to a random access memory (Random Access Memory, RAM), a read-only memory (Read-Only Memory, ROM), an erasable programmable read-only memory (Erasable Programmable Read-Only Memory, EPROM), or a portable read-only memory (Compact Disc Read-Only Memory, CD-ROM). The memory 220 is configured to store a set of program code and related data. The transceiver 230 is configured to receive and send information.

The processor 210 may be one or more central processing units (Central Processing Unit, CPU). When the processor 210 is one CPU, the CPU may be a single-core CPU, or may be a multi-core CPU.

The processor 210 in the encoding device is configured to read program code stored in the memory 220, to perform the following operations:

determining a size of a shift matrix based on a length of an information sequence and a length of an identifier sequence;

constructing a check matrix based on the size of the shift matrix and a base matrix; and performing low-density parity-check LDPC decoding on received data based on the check matrix, where the received data includes information about the identifier sequence and information about the information sequence.

The processor 210 is specifically configured to:

determine the size of the shift matrix according to the following formula:

$Z=(K+L)/(n_b-m_b)$, where

Z is the size of the shift matrix, K is a length of the information sequence, L is a length of the identifier sequence, $n_b$ is the number of columns of the base matrix, and $m_b$ is the number of rows of the base matrix.

In one embodiment, the identifier sequence is one of the following sequences: a sequence used to identify a transmit end device, a sequence used to identify a receive end device, a sequence used to identify a device group to which the transmit end device belongs, a sequence used to identify a device group to which the receive end device belongs, and a non-all-zero sequence agreed between the transmit end device and the receive end device by using signaling, where the transmit end device is a device that encodes the information sequence and the identifier sequence, and the receive end device is a device that receives an encoded information sequence and an encoded identifier sequence.

In one embodiment, the identifier sequence is a radio network temporary identifier sequence, a physical layer cell identifier sequence, or a device group identifier sequence.

It should be noted that for implementation of each operation, refer to the corresponding descriptions in the method embodiment shown in FIG. 7.

An embodiment of this disclosure further discloses a base station, including the encoding apparatus shown in FIG. 8 and/or the decoding apparatus shown in FIG. 10.

An embodiment of this disclosure further discloses a terminal, including the encoding apparatus (also referred to as an encoder) shown in FIG. 8 and/or the decoding apparatus (also referred to as a decoder) shown in FIG. 10.

Certainly, in addition to directly determining the size of the shift matrix based on the length of the information sequence and the length of the identifier sequence and constructing a corresponding check matrix described above, the check matrix in the embodiments in FIG. 3 and FIG. 4 may be further obtained by modifying an existing conventional check matrix. The check matrix may be obtained by the following steps:

S110. Construct a first check matrix based on a base matrix and a shift matrix.

Herein, the first check matrix may be constructed based on an existing algorithm, for example, the first check matrix is obtained by cyclically shifting the base matrix based on a shift factor, or the first check matrix is jointly constructed with reference to another algorithm. This is not limited in this embodiment of this disclosure. The shift factor may also be referred to as an extension factor.

Early LDPC code research mainly focuses on the performance area, and a constructed codeword usually has relatively high encoding and decoding complexity and requires a relatively large amount of storage space. Consequently, application of the codeword in an actual system is limited to some extent. In recent years, due to the emergence of a QC-LDPC code, encoding and decoding complexity is effectively reduced, and only a relatively small amount of storage space is required. In addition, the right part of the check matrix is designed to be in a form of a double diagonal or a triple diagonal, so that the check matrix can directly generate an LDPC code, thereby omitting an intermediate process of obtaining a generation matrix, and further reducing encoding complexity.

S120. When there is no padding bit in the first check matrix, extend the first check matrix based on a length of an identifier sequence, to obtain a second check matrix that includes a padding bit(s).

Specifically, a length of the padding bits in the second check matrix is greater than or equal to the length of the identifier sequence.

When there is no padding bit in the first check matrix, it indicates that a length K of an information sequence can be exactly divided by an information column $k_b$. In this case, there is no redundant information bit location. To extend a function of an existing check matrix and improve an identification degree of an encoded codeword, in this embodiment, the first check matrix that includes no padding bit may be extended, to obtain the second check matrix that includes padding bits.

In addition, to ensure that padding bits in the second check matrix are sufficient to pad the identifier sequence, the first check matrix may be extended based on the length of the identifier sequence, to ensure that a length of a padding bit in an extended second check matrix is greater than or equal to the length of the identifier sequence.

The identifier sequence is used to indicate identity information of a transmit end device, a receive end device, or a device group to which a transmit end device belongs.

It should be noted that the identifier sequence herein is a sequence or a sequence set that is known to both the transmit end device and the receive end device. For example, the identifier sequence may be an RNTI sequence, a PCI sequence, or a device group identifier (group identity, GI) sequence. An RNTI may be used as an identifier of a terminal, and a PCI may be used as an identifier of a base station cell. When some base stations send information to a device group including a plurality of terminals, the identifier sequence may also be the device group identifier sequence. In addition, for the transmit end device, for example, the base station sends downlink information to the terminal, the terminal sends uplink information to the base station. In a scenario in which terminals communicate with each other, an identifier sequence of the transmit end device may be padded into the check matrix, and an identifier sequence of the receive end device may also be sent, to improve an identification degree of the encoded codeword. This is not limited in this embodiment of this disclosure. For devices in one group, a plurality of devices in the group may directly share one device group identifier sequence, and the base station pads the device group identifier sequence into the check matrix. If all the devices in the group know identifier sequences of each other, the base station may pad, in an agreed sequence, identifier sequences of two or more devices in the group when sending information to the device group. Certainly, for two or more terminals that are not in the group but know identifier sequences of the other terminals, the base station may also pad the identifier sequences of the two or more terminals into the check matrix in the agreed sequence.

S130. Encode input information bits based on the second check matrix and output the encoded input information bits.

The identifier sequence is padded into the second check matrix, an output encoded codeword is easily identified. Therefore, when a decoder side device performs decoding, because only a target user knows the specific sequence of padding bits, the decoder side device may more reliably determine, based on a check result of a check equation of $Hc^T=0$, whether a received message belongs to the target user. H is the check matrix, c is a codeword obtained after the decoding, and the superscript T denotes the transpose of the matrix.

In the method, the first check matrix that includes no padding bits is extended, to obtain the second check matrix that includes padding bits, where the length of the padding bits is greater than the length of the identifier sequence. Then, the identifier sequence is padded into the padding bit of the second check matrix, so that the second check matrix includes the padding bit and can accommodate the identifier sequence. After the input information bit is encoded based on the second check matrix, an identification degree of the encoded codeword can be increased, so as to help the decoder side device to identify received information.

The following embodiment describes a method for extending the first check matrix:

In the encoding method, steps S210 and S220 are the same as steps S110 and S120, and steps S240 and S250 are the same as steps S130 and S140 in FIG. 3. Details are not described herein again. In this embodiment, the following step is further included.

S230. When there is a padding bit(s) in the first check matrix, compare a length of the padding bit(s) in the first check matrix with the length of the identifier sequence, and when the length of the padding bit in the first check matrix is less than the length of the identifier sequence, extend the first check matrix based on the length of the identifier sequence, to obtain the second check matrix that includes the padding bit(s).

There may be padding bit(s) in the first check matrix, or there may be no padding bit in the first check matrix. Therefore, when there are padding bits, the length of the padding bits in the first check matrix may be first compared with the length of the identifier sequence. When the length of the padding bits in the first check matrix is greater than or equal to the length of the identifier sequence, a complete identifier sequence may be padded into locations of the padding bits in the first check matrix, to improve an identification degree of the encoded codeword. When the length of the padding bits in the first check matrix is less than the length of the identifier sequence, the padding bits in the first check matrix need to be extended, and may be extended with reference to the length of the identifier sequence.

In one embodiment, when the first check matrix is extended based on the length of the identifier sequence, to obtain the second check matrix that includes the padding bit, the first check matrix may be extended by using the following method:

increasing the size of the shift matrix by n, and constructing the second check matrix that includes the padding bit based on the base matrix and an increased shift matrix, where n is an integer greater than 1; or performing a round-up, round-down, or round-off operation on a value obtained by multiplying the size of the shift matrix by m, and constructing the second check matrix that includes the padding bit based on the base matrix and an increased shift factor, where m is greater than 1.

Values of n and m may be determined based on the length of the identifier sequence.

For example, a current length K of the information sequence in the first check matrix is 1600, a length v of an RNTI sequence is 30, the number of information columns $k_b$ is equal to 32, and a size Z of a corresponding shift matrix is equal to $K/k_b$, namely, 50. Because K is exactly divided by $k_b$, there is no padding bit in the first check matrix, namely, a length of the padding bit $u=(Z \cdot k_b-K)=0$. In this case, a first shift matrix may be extended, for example, the shift matrix is extended to increase a quantity of padding bits, and a new shift matrix $Z'=Z+1=51$. In this case, the length of the padding bits $u=(Z' \cdot k_b-K)=51*32-1600=32$, and is greater than the length 30 of the RNTI. Therefore, an extended second check matrix meets the requirement, and the identifier sequence may be padded into the padding bit in the second check matrix. If the length v of the RNTI sequence is 50, and is greater than 32, a complete RNTI sequence cannot be padded by padding bits obtained by extending (Z+1). In this case, the RNTI sequence may be padded by 64 padding bits obtained by extending (Z+2), namely, 52. A check matrix that includes padding bits and for which a length of the padding bits is less than that of the RNTI may be extended by using the foregoing method.

Certainly, in addition to performing extension by adding Z by n, extension may be further performed by performing a rounding operation on a value obtained by multiplying Z. For example, when Z is equal to 50, extension may be performed by performing a round-down operation on Z*1.05, namely, 52.5 to obtain 52, or extension may be performed by performing a round-up operation on Z*1.025, namely, 51.25 to obtain 52 or by performing a round-down operation on Z*1.025, namely, 51.25 to obtain 51, or extension may be performed by performing a round-off operation on a product. This is not limited in this embodiment of this disclosure.

In the foregoing embodiment, two cases in which the first check matrix needs to be extended are mainly described, to be specific, a case in which there is no padding bit, and a case in which there are padding bits, but the length of the padding bits is less than the length of the identifier sequence. In the two cases, a extension method for extending padding bits in the first check matrix is provided in this embodiment, so as to obtain the second check matrix, where the length of the padding bits in the second check matrix is greater than or equal to the length of the identifier sequence. Finally, the identifier sequence is padded into the padding bits in the second check matrix, and an identification degree of the encoded codeword is improved.

There may be redundant padding bits in the second check matrix obtained by extending the first check matrix. In this case, the identifier sequence may be repeatedly padded into the redundant padding bit in the second check matrix.

The length of the padding bits in the second check matrix is greater than or equal to the length of the identifier sequence. Therefore, when the length of the padding bits in the second check matrix is greater than the length of the identifier sequence, there are redundant padding bits. In this case, the identifier sequence may be continuously and repeatedly padded into the redundant padding bits. For example, the length of the padding bit is 32, and the length of the RNTI sequence is 30. In this case, after 30 padding bit locations are padded into, the first two bits of the RNTI sequence may be padded into two redundant padding bit locations.

In addition, the RNTI sequence is a sequence known to both the transmit end device and the receive end device, and both the transmit end device and the receive end device know the length of the padding bit and the length of the RNTI sequence. Therefore, although several complete RNTI sequences cannot be fully padded, the receive end device may know a corresponding sequence that is to be used to pad the check matrix and complete the check. In addition, more known sequence information padded by the transmit end indicates a higher identification degree of the encoded codeword.

Certainly, in addition to repeatedly padding the identifier sequence into the padding bit, a zero sequence may also be padded into the redundant padding bit in the second check matrix. This is not limited in this embodiment of this disclosure.

For the encoding method in the foregoing embodiment for extending the first check matrix to obtain the second check matrix, system encoding and decoding performance may also be verified through emulation.

For details, refer to FIG. 5 and FIG. 6. FIG. 5 is a performance test diagram of padding different sequences into padding bits in a check matrix and performing decoding by using different sequences.

As shown in FIG. 5, a length K, namely, a code length, of the information sequence is 1000, a code rate R is equal to ⅓, there are 24 padding bits in the check matrix, and a horizontal coordinate Es/No is a symbol signal-to-noise ratio and a vertical coordinate is a block error rate (BLER) in the figure. A curve marked with circles is a common schematic diagram of an effect of using a zero sequence for padding and using a zero sequence for decoding, and a curve marked with asterisks is a schematic diagram of an effect of using an identifier sequence such as an RNTI or a PCI for padding and using a corresponding identifier sequence for decoding. It may be seen that the foregoing two curves basically overlap, in other words, using the encoding method in this embodiment of this disclosure does not cause any loss to system performance. However, a curve marked with squares is a schematic diagram of an effect of using a zero sequence for padding and using an identifier sequence for decoding. Neither a block error rate nor a symbol signal-to-noise ratio is satisfactory, and a system performance loss is relatively high.

FIG. 6 is a performance test diagram before and after padding bits are added in a check matrix. As shown in FIG. 6, a length K of an information sequence is 1600, a code rate R is equal to ⅓, Z0 is equal to 50, and an information column $k_b$ is 1600/50, namely, 32. In this case, there is no padding bit. A horizontal coordinate Es/No is a symbol signal-to-noise ratio and a vertical coordinate is a block error rate (BLER) in the figure. After Z0 is increased to obtain Z1: 51 and Z2: 52, there are 32 padding bits in a check matrix corresponding to Z1, and there are 64 padding bits in a check matrix corresponding to Z2. In FIG. 7, a curve with a circle is a schematic diagram of an effect generated when Z0 is equal to 50, a curve with an asterisk is a schematic diagram of an effect when Z1 is equal to 51, and a curve with a square block is a schematic diagram of an effect when Z2 is equal to 52. It may be seen that the foregoing three curves basically overlap, and a larger value of Z leads to a larger check matrix and a larger generated codeword distance. Therefore, system performance is relatively good.

The encoding apparatus described in this embodiment may be configured to: implement some or all processes in the method embodiments described with reference to FIG. 3 and FIG. 4 in the present disclosure, and perform some or all functions in the apparatus embodiment described with reference to FIG. 8 in this disclosure. The decoding apparatus described in this embodiment may be configured to: implement some or all processes in the method embodiment described with reference to FIG. 7 in this disclosure, and perform some or all functions in the apparatus embodiment described with reference to FIG. 10 in this disclosure. Details are not described herein.

All or some of the foregoing embodiments may be implemented by using software, hardware, firmware, or any combination thereof. When software is used to implement the embodiments, the embodiments may be implemented all or partially in a form of a computer program product. The computer program product includes one or more computer instructions. When the computer program instructions are loaded and executed on the computer, the procedures or functions according to the embodiments of this disclosure are all or partially generated. The computer may be a general-purpose computer, a dedicated computer, a computer network, or another programmable apparatus. The computer instructions may be stored in a computer readable storage medium or transmitted from a computer readable storage medium to another computer readable storage medium. For example, the computer instructions may be transmitted from a website, computer, server, or data center to another website, computer, server, or data center in a wired manner (for example, by using a coaxial cable, an optical fiber, or a digital subscriber line (DSL)) or a wireless (for example, infrared, radio, or microwave) manner. The computer readable storage medium may be any usable medium accessible by a computer, or a data storage device such as a server or a data center that integrates one or more usable media. The usable medium may be a magnetic medium (for example, a floppy disk, a hard disk, or a magnetic tape), an optical medium (for example, a DVD), a semiconductor medium (for example, a solid state disk Solid State Disk (SSD)), or the like.

It should be understood that "one embodiment" or "an embodiment" mentioned in the entire specification means that particular features, structures, or characteristics related to the embodiment are included in at least one embodiment of this disclosure. Therefore, "in one embodiment" or "in an embodiment" appearing throughout this specification may be not necessarily a same embodiment. Moreover, the particular features, structure or characteristics may be combined in one or more embodiments in any proper manner. Sequence numbers of the foregoing processes do not indicate an execution sequence. The execution sequence of the processes should be determined according to functions and internal logic of the processes, and should not be construed as any limitation on the implementation processes of the embodiments of this disclosure.

The term "and/or" in this specification describes only an association relationship for describing associated objects and represents that three relationships may exist. For example, A and/or B may represent the following three cases: Only A exists, both A and B exist, and only B exists. In addition, the character "/" in this specification generally indicates an "or" relationship between the associated objects. "B corresponding to A" indicates that B is associated with A, and B may be determined according to A. However, it should be further understood that determining B according to A does not mean that B is determined according to A only; that is, B may also be determined according to A and/or other information.

The foregoing descriptions are merely specific implementations of this disclosure, but are not intended to limit the protection scope of this disclosure. Any variation or replacement readily figured out by a person skilled in the art within the technical scope disclosed in this disclosure shall fall within the protection scope of this disclosure. Therefore, the protection scope of this disclosure shall be subject to the protection scope of the claims.

What is claimed is:

1. An encoding method based on a quasi-cyclic low-density parity-check (QC-LDPC) code, the encoding method being electronically implemented by a processor of an encoding processor, the encoding method comprising:
   determining, by an encoder, a size of a shift matrix based on a length of an information sequence and a length of an identifier sequence;
   constructing, by the encoder, a check matrix based on the size of the shift matrix and a base matrix;
   performing low-density parity-check (LDPC) encoding on the information sequence and the identifier sequence based on the check matrix to facilitate electronic communication of data over a communications network, wherein the identifier sequence is a non-all-zero sequence; and
   transmitting the encoded information to a receive end device.

2. The encoding method according to claim 1, wherein the size of the shift matrix is determined according to the following formula:

$Z=(K+L)/(n_b-m_b)$, where

Z is the size of the shift matrix, K is a length of the information sequence, L is a length of the identifier sequence, nb is a number of columns of the base matrix, and mb is a number of rows of the base matrix.

3. The encoding method according to claim 1, wherein the identifier sequence is one of: a sequence identifying a transmit end device, a sequence identifying a receive end device, a sequence identifying a device group to which the transmit end device belongs, a sequence identifying a device group to which the receive end device belongs, or a non-all-zero sequence agreed between the transmit end device and the receive end device by using signaling, wherein the transmit end device is a device that encodes the information sequence and the identifier sequence, and the receive end device is a device that receives an encoded information sequence and an encoded identifier sequence.

4. The encoding method according to claim 1, wherein the check matrix comprises redundant information bit locations, the method further comprising: repeatedly padding the identifier sequence into the redundant information bit locations of the check matrix; or
   padding an all-zero sequence or an all-one sequence into the redundant information bit locations of the check matrix.

5. A decoding method based on a quasi-cyclic low-density parity-check (QC-LDPC) code, the decoding method being electronically implemented by a processor of a decoding processor, the decoding method comprising:
   receiving data from a transmit end device, wherein the received data includes an information sequence;
   determining, by a decoder, a size of a shift matrix based on a length of the information sequence and a length of an identifier sequence;
   constructing, by the decoder, a check matrix based on the size of the shift matrix and a base matrix; and
   performing low-density parity-check (LDPC) decoding on the received data based on the check matrix to facilitate electronic communication of data over a communications network, wherein the received data comprises information about the identifier sequence and information about the information sequence.

6. The decoding method according to claim 5, wherein the size of the shift matrix is determined according to the following formula:

$Z=(K+L)/(n_b-m_b)$, where

Z is the size of the shift matrix, K is a length of the information sequence, L is a length of the identifier sequence, nb is a number of columns of the base matrix, and mb is a number of rows of the base matrix.

7. The decoding method according to claim 5, wherein the identifier sequence is one of: a sequence identifying a transmit end device, a sequence identifying a receive end device, a sequence identifying a device group to which the transmit end device belongs, a sequence identifying a device group to which the receive end device belongs, or a non-all-zero sequence agreed between the transmit end device and the receive end device by using signaling, wherein the transmit end device is a device that encodes the information sequence and the identifier sequence, and the receive end device is a device that receives an encoded information sequence and an encoded identifier sequence.

8. An encoding apparatus comprising memory and a processor configured to execute program codes stored in the memory to cause the encoding apparatus to perform:

determining a size of a shift matrix based on a length of an information sequence and a length of an identifier sequence;

constructing a check matrix based on the size of the shift matrix and a base matrix; and performing low-density parity-check (LDPC) encoding on the information sequence and the identifier sequence based on the check matrix to facilitate electronic communication of data over a communications network, wherein the identifier sequence is a non-all-zero sequence; and transmitting the encoded information to a receive end device.

9. The encoding apparatus according to claim 8, wherein the determining unit is configured to:

determine the size of the shift matrix according to the following formula:

$Z=(K+L)/(n_b-m_b)$, where

Z is the size of the shift matrix, K is a length of the information sequence, L is a length of the identifier sequence, nb is a number of columns of the base matrix, and mb is a number of rows of the base matrix.

10. The encoding apparatus according to claim 8, wherein the identifier sequence is one of: a sequence identifying a transmit end device, a sequence identifying a receive end device, a sequence identifying a device group to which the transmit end device belongs, a sequence identifying a device group to which the receive end device belongs, or a non-all-zero sequence agreed between the transmit end device and the receive end device by using signaling, wherein the transmit end device is a device that encodes the information sequence and the identifier sequence, and the receive end device is a device that receives an encoded information sequence and an encoded identifier sequence.

11. The encoding apparatus according to claim 8, wherein the check matrix comprises redundant information bit locations, and the encoding apparatus is further caused to perform:

repeatedly padding the identifier sequence into the redundant information bit locations of the check matrix; or padding an all-zero sequence or an all-one sequence into the redundant information bit locations of the check matrix.

* * * * *